(12) United States Patent
DeKraker et al.

(10) Patent No.: US 7,819,984 B2
(45) Date of Patent: *Oct. 26, 2010

(54) PROCESS FOR TREATMENT OF SUBSTRATES WITH WATER VAPOR OR STEAM

(75) Inventors: David DeKraker, Burnsville, MN (US); Jeffery W. Butterbaugh, Eden Prairie, MN (US); Richard E. Williamson, Chanhassen, MN (US)

(73) Assignee: FSI International, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/152,641

(22) Filed: May 15, 2008

(65) Prior Publication Data

US 2008/0283090 A1 Nov. 20, 2008

Related U.S. Application Data

(60) Provisional application No. 60/930,720, filed on May 18, 2007.

(51) Int. Cl.
*B08B 3/08* (2006.01)
(52) U.S. Cl. .......................... 134/30; 134/31
(58) Field of Classification Search ............... 134/30
See application file for complete search history.

(56) References Cited

U.S. PATENT DOCUMENTS

| | | | |
|---|---|---|---|
| 4,778,536 A * | 10/1988 | Grebinski | 134/36 |
| 5,037,506 A | 8/1991 | Gupta et al. | |
| 5,785,875 A | 7/1998 | Hawthorne et al. | |
| 5,858,106 A | 1/1999 | Ohmi et al. | |

(Continued)

FOREIGN PATENT DOCUMENTS

JP 2004351321 A * 12/2004

(Continued)

OTHER PUBLICATIONS

International Search Report mailed Nov. 3, 2008 (3 pgs).

(Continued)

*Primary Examiner*—Michael Kornakov
*Assistant Examiner*—Natasha Campbell

(57) ABSTRACT

A method of treating a substrate comprises, in one aspect, placing a substrate having material on a surface thereof in a treatment chamber; directing a stream of a liquid treatment composition to impinge the substrate surface; and directing a stream of water vapor to impinge the substrate surface and/or to impinge the liquid treatment composition. A preferred aspect of this invention is the removal of materials, and preferably photoresist, from a substrate, wherein the treatment composition is a liquid sulfuric acid composition comprising sulfuric acid and/or its desiccating species and precursors. In another aspect, a liquid sulfuric acid composition comprising sulfuric acid and/or its desiccating species and precursors are dispensed onto a portion of the substrate surface that is less than the entire surface of the substrate in an amount effective to treat the portion of the substrate surface, and the liquid sulfuric acid composition is exposed to water vapor in an amount effective to increase the temperature of the liquid sulfuric acid composition above the temperature of the liquid sulfuric acid composition prior to exposure to the water vapor. The substrate may be enveloped with a water vapor and/or a optionally nitrogen gas environment during the treatment steps.

6 Claims, 6 Drawing Sheets

U.S. PATENT DOCUMENTS

| | | | |
|---|---|---|---|
| 5,861,064 A | 1/1999 | Oikari et al. | |
| 5,971,368 A | 10/1999 | Nelson et al. | |
| 5,998,305 A | 12/1999 | Holmer et al. | |
| 6,032,682 A | 3/2000 | Verhaverbeke | |
| 6,146,469 A | 11/2000 | Toshima | |
| 6,231,775 B1 | 5/2001 | Levenson et al. | |
| 6,235,641 B1 | 5/2001 | Christenson | |
| 6,242,368 B1 | 6/2001 | Holmer et al. | |
| 6,274,506 B1 | 8/2001 | Christenson et al. | |
| 6,403,544 B1 | 6/2002 | Davenhall et al. | |
| 6,406,551 B1 | 6/2002 | Nelson et al. | |
| 6,451,118 B1 | 9/2002 | Garriga | |
| 6,488,272 B1 | 12/2002 | Nguyen | |
| 6,584,989 B2 | 7/2003 | Taft et al. | |
| 6,598,805 B2 * | 7/2003 | Sakai et al. | 239/128 |
| 6,599,438 B2 | 7/2003 | Levenson et al. | |
| 6,610,168 B1 | 8/2003 | Miki et al. | |
| 6,648,307 B2 | 11/2003 | Nelson et al. | |
| 6,689,284 B1 | 2/2004 | Nakasaki | |
| 6,770,424 B2 * | 8/2004 | Mandal et al. | 430/311 |
| 6,817,370 B2 | 11/2004 | Bergman et al. | |
| 6,848,455 B1 | 2/2005 | Shrinivasan et al. | |
| 6,849,192 B2 | 2/2005 | Nakasaki | |
| 6,867,148 B2 | 3/2005 | Yates et al. | |
| 6,869,487 B1 | 3/2005 | Bergman | |
| 6,908,565 B2 | 6/2005 | Kim et al. | |
| 7,163,588 B2 | 1/2007 | Bergman | |
| 7,305,999 B2 | 12/2007 | Henke et al. | |
| 2002/0112744 A1 * | 8/2002 | Besseling | 134/30 |
| 2002/0157686 A1 * | 10/2002 | Kenny et al. | 134/1.3 |
| 2002/0170573 A1 | 11/2002 | Christenson et al. | |
| 2003/0190870 A1 | 10/2003 | Shih et al. | |
| 2005/0200123 A1 | 9/2005 | Benson et al. | |
| 2005/0205115 A1 | 9/2005 | Okuyama et al. | |
| 2007/0227556 A1 * | 10/2007 | Bergman | 134/3 |
| 2007/0243700 A1 | 10/2007 | Qin et al. | |
| 2008/0008834 A1 | 1/2008 | Collins et al. | |

FOREIGN PATENT DOCUMENTS

| | | | |
|---|---|---|---|
| SU | | 865975 B | 9/1981 |

OTHER PUBLICATIONS

Valensi, et al, "SULPHUR ($^1$) Equilibrium Diagram and its Interpretation," Atlas of Electrochemical Equilibria in Aqueous Solutions, Section 19.2, (1974), pp. 551-553.

Wei, et al, "Alternative Methods for Resist Stripping," Electrochemcial Society Proceedings vol. 97-35, (1998), pp. 496-504.

Verhaverbeke, et al, "Organic Contamination Removal," Contamination-Free Manufacturing for Semiconductors and Other Precision Products, Chapter 9, (2001), pp. 317-331.

* cited by examiner

PROCESS FOR TREATMENT OF SUBSTRATES WITH WATER VAPOR OR STEAM

CROSS-REFERENCE TO RELATED APPLICATIONS

This application claims the benefit of U.S. Provisional Application Ser. No. 60/930,720, filed May 18, 2007, entitled "PROCESS FOR TREATMENT OF SUBSTRATES WITH WATER VAPOR OR STEAM" which application is incorporated herein by reference in its entirety.

FIELD OF THE INVENTION

The present invention relates to methods for treatment of substrates with water vapor or steam. In an aspect of the present invention, material (and preferably photoresist materials) is removed substrates using sulfuric acid and water vapor.

BACKGROUND OF THE INVENTION

Advances in electronic technology cause integrated circuits to be formed on substrates such as silicon wafers with ever increasing packing density of active components. The formation of circuits is carried out by sequential application, processing, and selective removal of various components from the substrate. Various compositions have been developed for removal of specific classes of components from substrates in semiconductor wafer technologies. For example, a composition commonly denoted SC-1, which contains a mixture of $NH_4OH$ (29 wt %)/$H_2O_2$ (30 wt %)/water at a volume ratio of about 1:1:5 (or at somewhat higher dilution ratios), is typically used to remove particles and to reoxidize hydrophobic silicon surfaces. Similarly, a composition commonly denoted SC-2, which contains a mixture of HCl (37 wt %)/$H_2O_2$ (30 wt %)/water at a volume ratio of about 1:1:5 (or at somewhat higher dilution ratios), is typically used to remove metals. An additional composition, commonly called a Piranha composition, comprises $H_2SO_4$ (98 wt %)/$H_2O_2$ (30 wt %) at a volume ratio of about 2:1 to 20:1, and is typically used to remove organic contamination or some metal layers.

Photoresist materials are used in many circuit manufacturing processes to assist in formation of sequential layers. In stages of the manufacturing process, these photoresist materials are often removed, preferably without substantial damage to the substrate, including structures formed thereon. Photoresists are conventionally removed using organic solvents, such as n-methyl-pyrrolidone ("NMP"), glycol ether, amine, or dimethyl sulfoxide ("DMSO"). Alternatively, photoresist materials have been removed using inorganic chemical agents such as sulfuric acid and hydrogen peroxide, or using reactive gaseous chemicals generally known as photoresist plasma ashing. U.S. Pat. No. 5,785,875 discloses a method for removing photoresist material by carrying out a wet acid etch by fully submerging the wafers within anhydrous acid, and draining the etching agent from the chamber while inserting a heated solvent vapor. The solvent is, for example acetone, alcohols, or another solvent, but preferably comprises isopropyl alcohol, and is heated to the range of between about 50° C. and about 100° C. Traditional wet chemical processes used to remove photoresist rely on concentrated sulfuric acid combined with hydrogen peroxide (Piranha or "Sulfuric-Peroxide Mix" or SPM) or ozone (sulfuric-ozone mix or "SOM"). Alternatively, photoresists can be removed under certain conditions by using ozone dissolved in DI water or by mixing ozone gas with water vapor at elevated temperatures.

Particularly challenging is the removal of patterned photoresist that has been subjected to ion implantation processes, which cause hardening of the resist surface. An approach to removing this implanted photoresist is to increase the temperature of the chemical treatment. Additionally, removal of dopants that are applied to substrates by plasma doping can be very difficult. US Patent Publication No. 20070243700 describes a technique whereby the dopant-containing layer is stated to be removed from the photoresist layer by exposing the dopant-containing layer to a water rinse, a chlorinated plasma or to a fluorinated plasma.

It would be desirable to identify alternative techniques and compositions for treatment of substrates, particularly to remove materials, especially organic materials, and most especially photoresist materials from substrates such as semiconductor wafers.

SUMMARY OF THE INVENTION

Applying hot chemicals to substrates is challenging, because heating the chemicals presents concerns in safety, in the effectiveness of the chemicals, and in durability of the equipment used to contain and handle the chemicals. As for safety, the handling of potentially harsh, caustic, and aggressive liquid or gaseous chemicals alone raises certain concerns. Heating these materials to high temperatures only compounds the concerns because the materials are more volatile and prone to escaping in larger amounts into the atmosphere. Additionally, certain treatment chemicals degrade or are less effective over time due to undesired or inadvertent reactions that are promoted at a higher temperature. Finally, treatment chemicals tend to have an even higher adverse effect on vessels, tubing, valves, pumps, etc. when they are provided in the system at a higher temperature. It is desirable to provide treatment chemicals with high energy associated with heat at or near the time of contact with the substrate to be treated.

In one aspect of the present invention, a method of treating a substrate is provided, comprising a) placing a substrate having material on a surface thereof in a treatment chamber; b) directing a stream of a liquid treatment composition to impinge the substrate surface; and c) directing a stream of water vapor to impinge the substrate surface and/or to impinge the liquid treatment composition. Preferably, the stream of water vapor is in the form of steam.

Because energy is provided in the form of the steam of water vapor, the treatment composition does not need to be pre-heated to as high a level prior to dispensing onto a substrate as previously required. In a preferred embodiment, the treatment composition interacts with the water vapor to provide an enhanced benefit of treatment activity. In this embodiment, provision of the stream of water vapor in a manner that impinges the substrate surface and/or to impinge the liquid treatment composition provides more effective dispensing of the water vapor where it is needed, rather than merely providing a water vapor in the chamber in the hope that enough water vapor is present to accomplish the desired enhancement of benefit of the treatment activity.

Additionally, because heat and/or interaction of the water vapor with the treatment composition is so effective at the surface of the substrate to be treated, significant efficiencies can be observed in the time required for actual treatment of the substrate. In particular, substantial reduction in treatment time may be observed in the removal of photoresist materials using a modified SPM process as described herein.

Examples of treatment compositions that can be used in the present invention include wafer cleaning systems that are conventional in the art, such as the SC-1 composition ($NH_4OH$/Peroxide/Water), the SC-2 composition (HCl/Peroxide/Water), the Piranha or SPM composition (Sulfuric Acid/Peroxide), SOM (sulfuric acid/ozone) compositions, sulfuric acid compositions, buffered oxide etch (HF and ammonium fluoride) compositions, and $NH_4OH$, $H_3PO_4$, HF, HCl or HF/HCl compositions.

A preferred treatment of the present invention is the removal of material, and particularly of photoresist material. As noted above, sulfuric acid/peroxide mixtures have been used in wet chemical processes. It has been determined that applying sulfuric acid and/or its desiccating species and precursors (e.g. sulfur trioxide ($SO_3$), thiosulfuric acid ($H_2S_2O_3$), peroxosulfuric acid ($H_2SO_5$), peroxydisulfuric acid ($H_2S_2O_8$), fluorosulfuric acid ($HSO_3F$), and chlorosulfuric acid ($HSO_3Cl$)) to photoresist coated substrates in an immersion bath environment, even at elevated temperature, is not effective in removal of harshly treated photoresist. In view of this it has surprisingly been found that sulfuric acid and desiccating sulfuric acid species and precursors can be effective in removing materials, especially organic materials and most especially photoresist materials from the surface of substrates using certain advantageous treatment techniques.

In one aspect of the present invention, a method of removing material from a substrate is provided, comprising a) placing at least one substrate having material on a surface thereof in a treatment chamber; b) directing a stream of a liquid sulfuric acid composition comprising sulfuric acid and/or its desiccating species and precursors to impinge the substrate surface; and c) directing a stream of water vapor to impinge the substrate surface and/or to impinge the liquid sulfuric acid composition. Preferably, the liquid sulfuric acid composition has a water/sulfuric acid molar ratio of no greater than about 5:1, and is exposed to water vapor in an amount effective to increase the temperature of the liquid sulfuric acid composition above the temperature of the liquid sulfuric acid composition prior to exposure to the water vapor.

By directing both the stream of liquid sulfuric acid composition and the stream of water vapor in the manner described, effective mixing of these components at or near the surface of the substrate is accomplished, with surprisingly effective stripping rates being achieved.

In another aspect of the present invention, a method of removing material from a substrate is provided, comprising a) placing at least one substrate having material on a surface thereof in a treatment chamber; b) dispensing a liquid sulfuric acid composition comprising sulfuric acid and/or its desiccating species and precursors onto a portion of the substrate surface that is less than the entire surface of the substrate in an amount effective to treat the portion of the substrate surface; and c) exposing the liquid sulfuric acid composition to water vapor in an amount effective to increase the temperature of the liquid sulfuric acid composition above the temperature of the liquid sulfuric acid composition prior to exposure to the water vapor; wherein the liquid sulfuric acid composition at the time of exposure to water vapor has a water/sulfuric acid molar ratio of no greater than about 5:1.

It has been found that selective dispensing of the liquid sulfuric acid composition onto a portion of the substrate surface that is less than the entire surface of the substrate is advantageous in certain applications. By controlling the dispense of the liquid sulfuric acid composition in this manner, portions of the substrate in greater need for treatment can be selectively treated.

In an embodiment of the present invention, the liquid sulfuric acid composition is exposed to water vapor in an amount effective to increase the temperature of the liquid sulfuric acid composition above both (i) the temperature of the liquid sulfuric acid composition prior to exposure to the water vapor and (ii) the temperature of the water vapor. In a preferred embodiment, a liquid sulfuric acid composition having a water/sulfuric acid molar ratio of no greater than about 5:1 is exposed to water vapor in an amount effective to increase the temperature of the liquid sulfuric acid composition on the substrate surface above both (i) the on-substrate temperature of the liquid sulfuric acid composition prior to exposure to the water vapor and (ii) the temperature of the water vapor. The present method is particularly significant in the case of removal of photoresist materials, even in the case when the photoresist is baked onto the substrate or when the photoresist is heavily ion implanted, under certain process conditions.

In an embodiment of the present invention, it has been discovered that the oxidizing agent of acidic or basic treatment compositions traditionally useful in silicon wafer treatment can advantageously not be present in the acidic or basic composition when stored or prepared for use in the treatment method, but can be added to the treatment composition immediately prior to dispensing on the substrate, can be introduced with the water vapor at or near the surface of the substrate to be treated, or can be introduced as a separate component at or near the surface of the substrate to be treated. As a specifically preferred example, the peroxide or the ozone in sulfuric acid compositions known as SPM and SOM compositions can be advantageously added to the sulfuric acid composition in the dispense line between the supply reservoir and the dispense nozzle. In another embodiment, the oxidizing agent can be introduced with the water vapor rather than the sulfuric acid composition at or near the surface of the substrate to be treated. In another embodiment, the oxidizing agent can be dispensed as a separate component from both the sulfuric acid composition component and the water vapor component. While not being bound by theory, it is believed that separation of the oxidizing component from the acid or base composition provides advantages in stability and effectiveness.

In an aspect of the present invention, a method of treating a substrate is provided, comprising a) placing a substrate having material on a surface thereof in a treatment chamber; b) directing a stream of a liquid treatment composition to impinge the substrate surface; c) directing a stream of water vapor to impinge the substrate surface and/or to impinge the liquid treatment composition, and d) additionally introducing water vapor and/or nitrogen gas into the treatment chamber to envelop the substrate with a water vapor and/or a nitrogen gas environment during the treatment steps b) and c).

DETAILED DESCRIPTION

Figure 1:
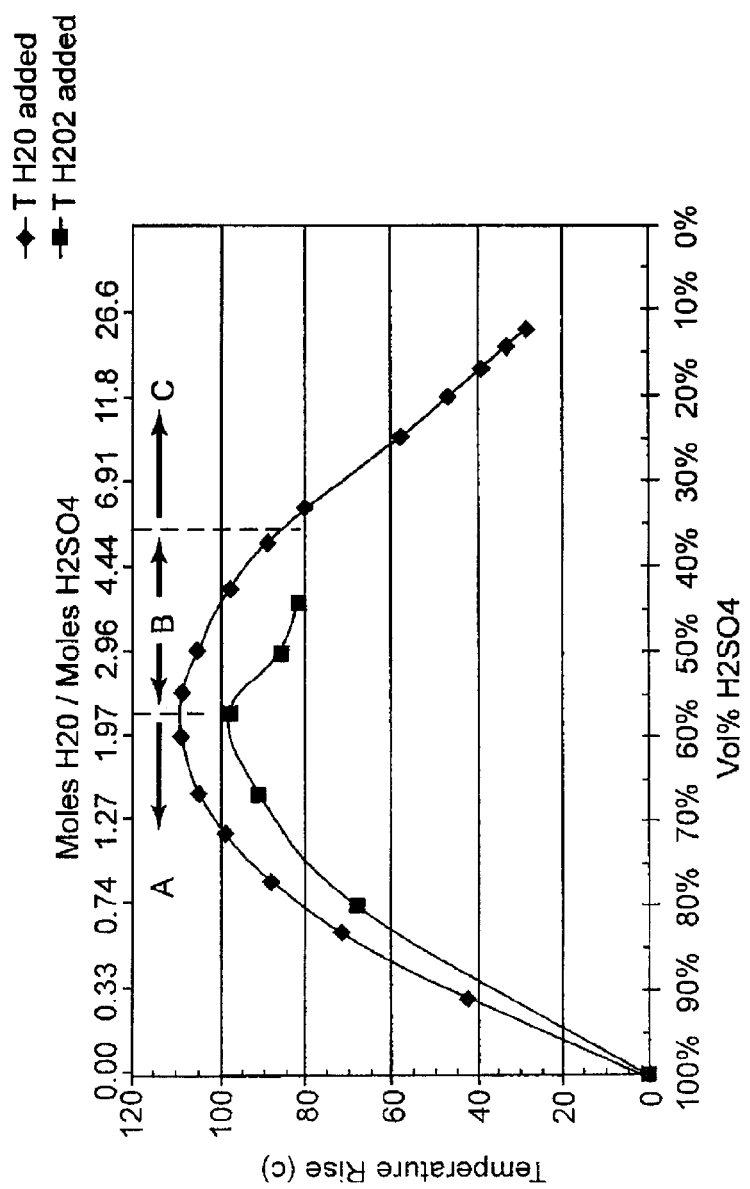
FIG. 1 is a graph showing the resulting temperature rise when liquid water or $H_2O_2$ (30 wt %) is added to $H_2SO_4$ (96 Wt %).

The above mentioned and other advantages of the present invention, and the manner of attaining them will become more apparent, and the invention itself will be better understood by reference to the following description of the embodiments of the invention taken in conjunction with the accompanying drawings.

For purposes of brevity, liquid sulfuric acid compositions as discussed herein will be understood to comprise sulfuric acid and/or its desiccating sulfuric acid species and precursors, and discussions regarding sulfuric acid contained in these liquid compositions will likewise be understood to describe corresponding compositions comprising sulfuric acid and/or its desiccating sulfuric acid species and precursors. Examples of desiccating sulfuric acid species and precursors of sulfuric acid include sulfur trioxide ($SO_3$), thiosulfuric acid ($H_2S_2O_3$), peroxosulfuric acid ($H_2SO_5$), peroxydisulfuric acid ($H_2S_2O_8$), fluorosulfuric acid ($HSO_3F$), and chlorosulfuric acid ($HSO_3Cl$). In an embodiment of the present invention, a desiccating species of sulfuric acid is a complex of sulfuric acid with an oxidizing agent. For purposes of the present invention, the water/sulfuric acid molar ratio is calculated for compositions comprising the desiccating sulfuric acid species and precursors based on the molar ratio in the final mixture of water to the moles present of the desiccating sulfuric acid species or precursor.

For purposes of the present invention, water vapor is defined as water in the gaseous form, and distinguished from small droplets of water commonly called "mist." Because mist is water that is condensed in the form of small droplets, there is essentially no net warming effect when mist settles on a surface that would correspond to a heat of vaporization. For purposes of the present invention, steam is vaporized water at or above the boiling point of water, which depends on the pressure, e.g. 100° C. if the pressure is 1 atmosphere. When steam is provided at a temperature greater than the boiling point of water, is it called superheated steam. Water vapor optionally may be provided from compositions comprising components in addition to water, such as dissolved gasses such as ozone, or inert gasses such as nitrogen. It is contemplated that water vapor may be supplied to the sulfuric acid composition in any manner, either essentially pure, or in compositions, either above, or below or at 100° C., and having pressures or partial pressures of water vapor either above, below or at 1 atm. The water vapor optionally may further comprise additional ingredients, such as an oxidizing agent as discussed above. Other ingredients, such as surfactants, cosolvents or the like, are additionally contemplated.

The present invention may be used in single wafer processing applications where the wafers are either moving or fixed, or in batch applications. Alternatively, the method of the present invention may be used to process multiple wafer-like objects simultaneously, as occurs with batches of wafers when being processed in a spray processing tool such as the MERCURY® or ZETA® spray processors commercially available from FSI International, Inc., Chaska, Minn., or the Magellan® system, also commercially available from FSI International, Chaska, Minn.

In an embodiment of the present invention, it has been found that the effectiveness and efficiency of removal of materials from the surface of a substrate is particularly enhanced wherein the liquid sulfuric acid composition has a water/sulfuric acid molar ratio of no greater than about 3:1, or no greater than about 2:1. In a preferred embodiment of the present invention, it has been found that the effectiveness and efficiency of removal of materials from the surface of a substrate is particularly enhanced wherein the liquid sulfuric acid composition having a water/sulfuric acid molar ratio of no greater than about 1:2. In an embodiment of the invention, the liquid sulfuric acid composition does not contain water. For ease in obtaining materials, however, an embodiment of the invention contemplates that the liquid sulfuric acid composition will contain at least as much water as is conventionally present in the raw materials. In another embodiment of the present invention, the liquid sulfuric acid composition has a water/sulfuric acid molar ratio of from about 1:2 to about 1:4.

Stated another way, preferably the liquid sulfuric acid has a concentration by volume greater than about 50 vol %, more preferably greater than 80 vol %, and most preferably greater than 90 vol %. For purposes of the present invention, when volume ratios of sulfuric acid are discussed, it is intended that the content of sulfuric acid is calculated based on 96 Wt % sulfuric acid source. Thus, a sulfuric acid/water composition comprising sulfuric acid in a content of 50% by volume comprises 50 vol % of 96 Wt % sulfuric acid and 50 vol % water.

Preferably, the substrate is heated to a temperature of at least about 90° C. either before, during or after dispensing of the liquid sulfuric acid composition. The liquid sulfuric acid composition is exposed to water vapor in an amount effective to increase the temperature of the liquid sulfuric acid composition on the substrate surface above the temperature of the liquid sulfuric acid composition prior to exposure to the water vapor. In an embodiment of the present invention, the liquid sulfuric acid composition is exposed to water vapor in an amount effective to increase the temperature of the liquid sulfuric acid composition on the substrate surface above both (i) the temperature of the on-substrate liquid sulfuric acid composition prior to exposure to the water vapor and (ii) the temperature of the water vapor. Either after or between steps of the above described treatment, the substrate is preferably rinsed.

It has been found that the amount of water present in the liquid sulfuric acid composition prior to or as applied to the substrate is important to the effectiveness of the removal of undesired material. Specifically, it has been found that sulfuric acid compositions that initially contain too much water are less able to strip resist when exposed to water vapor. While not being bound by theory, it is believed that these diluted sulfuric acid compositions are either less able to take up water vapor in an amount effective to increase the temperature of the liquid sulfuric acid composition above the temperature of the liquid sulfuric acid composition prior to exposure to the water vapor, or the chemical activity of the composition is decreased by the water, or both.

In embodiments where the substrate is at an ambient processing temperature below the boiling point of water (particularly in a temperature range of about 20-60° C.), the temperature of the liquid sulfuric acid composition is substantially increased upon addition of water vapor. Surprisingly, it further has been found that even when the substrate and/or the sulfuric acid composition is at a high temperature (e.g. greater than about 90° C.), and particularly at a temperature at or above 100° C., the water vapor is taken up by the liquid sulfuric acid composition even though the temperature of the liquid sulfuric acid composition is near or above the boiling point of water. While not being bound by theory, it is believed that the liquid sulfuric acid has a desiccating effect, thereby causing water from the water vapor to be condensed into the liquid sulfuric acid composition and releasing the energy corresponding roughly to the heat of vaporization stored in the water vapor.

In one embodiment of the present invention, the substrate is pretreated with a pretreatment liquid, such as an acid pretreatment, surfactant or solvent, that acts to modify the surface characteristics of the substrate as desired.

As noted above, in an aspect of the present invention water vapor and/or nitrogen gas is additionally introduced into the treatment chamber to envelop the substrate with a water vapor and/or a optionally nitrogen gas environment during the treatment steps b) and c). While not being bound by theory, it is believed that, in the case of the addition of water vapor, this enveloping step increases the amount of heat and water available for interaction with the treatment chemicals. It has been observed that addition of water vapor in this manner in particular enhances the etching at the edge of the substrate.

Additionally, while not being bound by theory, it is believed that, in the case of the addition of nitrogen, this enveloping step excludes atmospheric components that may adversely interact with the treatment chemicals. It has been observed that addition of nitrogen gas in this manner in particular enhances the etching at the center of the substrate. Methods wherein both water vapor and nitrogen gas are introduced into the treatment chamber to envelop the substrate thus can advantageously provide a process with uniform treatment profiles. In an aspect of the present invention, substantially all of the gas present in the treatment chamber is nitrogen gas. In another aspect of the present invention, substantially all of the gas present in the treatment chamber is water vapor-containing nitrogen gas.

Preferably the water vapor of the envelopment is introduced so that it is exposed to the substrate at a water vapor temperature of from about 70° C. to about 160° C. More preferably, the water vapor of the envelopment is introduced so that it is exposed to the substrate at a water vapor temperature of from about 100° C. to about 150° C. In a particularly advantageous embodiment, the water vapor of the envelopment is introduced so that it is exposed to the substrate at a water vapor temperature of from about 120° C. to about 140° C.

In an embodiment of this invention, an SC1 composition (1:1:10 hot SC1) is atomized by impinging the liquid stream of SC1 solution with steam, and the substrate being treated is simultaneously enveloped in water vapor. This combination of steam impingement with simultaneously enveloping of the substrate being treated with water vapor can provide an increase of the etch rate to 5 angstroms/min (approximately a 4× improvement over the best known commercially available method).

In another aspect of this embodiment, the substrate being treated is simultaneously enveloped in both water vapor and $N_2$. The combination of these components in the envelopment provides surprisingly uniform etch profiles over the lateral dimension of the substrate, from edge to center.

The treatment of substrates with an SC1 composition that is atomized by impinging the liquid stream of SC1 solution with steam while the substrate is simultaneously enveloped in water vapor and/or $N_2$ is particularly advantageous for removal of dopants that are applied to substrates by plasma doping.

With reference to the figures, wherein like numerals are used to label like components throughout the several figures:

FIG. 1 shows the resulting temperature when 20° C. $H_2SO_4$ (96 Wt %) is mixed with 20° C. liquid water or 20° C. $H_2O_2$ (30 wt %) in a rapidly stirred beaker. In region A, at $H_2SO_4$ volume fractions between approximately 100% and 57%, the $H_2SO_4$/water blend increases in temperature with increasing water content. In region B, at fractions between approximately 56% and 36%, the $H_2SO_4$/water blend decreases slowly in temperature with increasing water content. In region C, at fractions between approximately 35% and 10%, the temperature of the blend decreases rapidly with increasing water content. The temperature profile of $H_2SO_4$ mixed with $H_2O_2$ follows the same trend, but with a slightly lower maximum temperature. A maximum temperature rise of approximately 110° (130° C. final temperature) is obtained with an $H_2SO_4$/water blend that is a blend of approximately 57 vol % $H_2SO_4$ and 43 vol % $H_2O_2$. Also shown on the top axis is the $H_2O$ to $H_2SO_4$ mole ratio of the water:$H_2SO_4$ blend. The boundaries between regions A and B is approximately 2:1 water:$H_2SO_4$, and between B and C is approximately 5:1.

Figure 2:
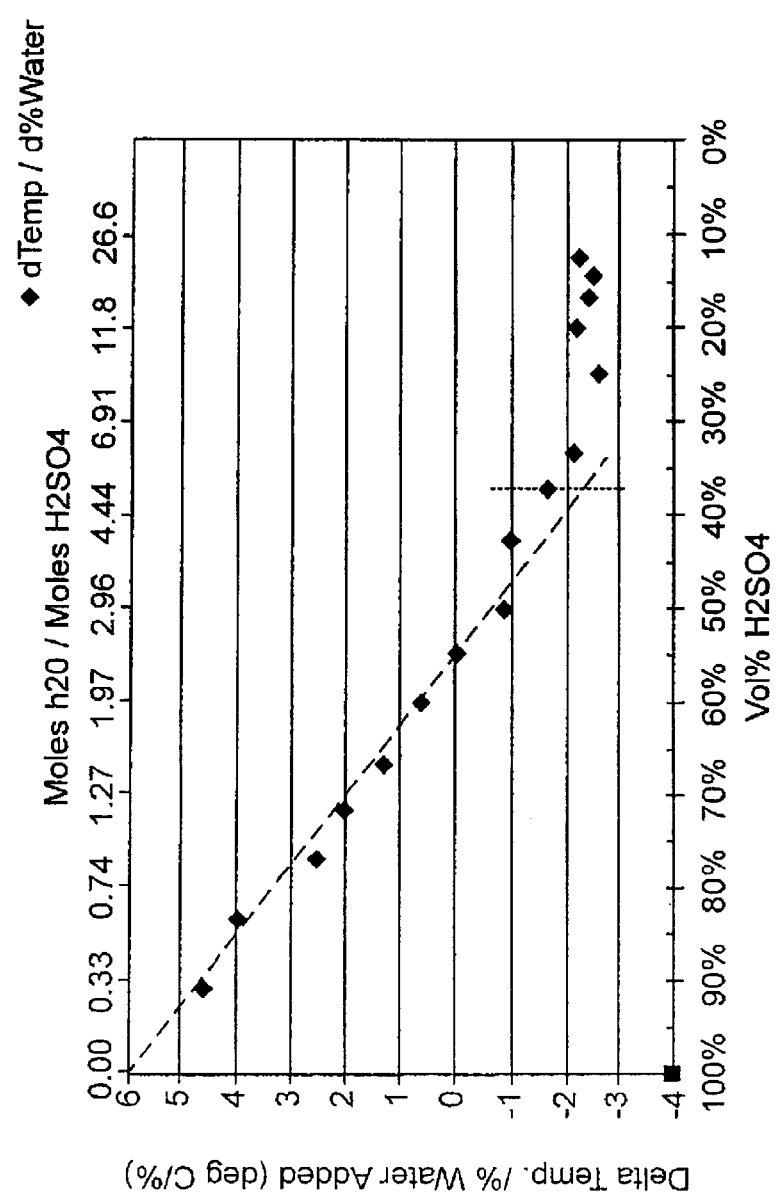
FIG. 2 is a graph showing the temperature rise when liquid water is added to a blend of $H_2SO_4$ (96 Wt %)/water as a function of the fraction of $H_2SO_4$ (96 Wt %) in the solution.

FIG. 2 shows the derivative of the water-added curve from FIG. 1. This shows the rise in temperature for each percent increase in water content as a function of the fraction of the $H_2SO_4$ in the solution. There is an almost linear decrease in dT/dWater from 100% to 37% $H_2SO_4$ fraction. While not being bound by theory, it is believed that the temperature increase of the solution (the heat of mixing) is being caused by the heat of hydration as water molecules coordinate around each sulfuric acid molecule. In the present invention, this strong attraction between the water and sulfuric molecules drives the desiccant action that draws water vapor from the atmosphere and into the sulfuric acid composition, even when the temperature of the sulfuric acid composition is above the boiling point of water. At approximately 55 vol % sulfuric acid, the heat of hydration is balanced by the thermal load of the added water, and additional added water has a net cooling effect on the blend. At approximately 37 vol % $H_2SO_4$, the hydration of $H_2SO_4$ appears to be complete. As shown in the upper x-axis of FIGS. 1 and 2 show the mole ratio of water: $H_2SO_4$ in the solution. The hydration appears to be complete when approximately 5 moles of water are present for each mole of $H_2SO_4$.

In contrast to FIG. 1, the present invention adds water to the sulfuric acid composition by condensation of water vapor into the composition. This results in the heating of the composition not only by the heat of mixing between $H_2SO_4$ and $H_2O$, but also by the water's heat of vaporization that is regained when the water condenses into the sulfuric acid composition. Compared to adding liquid water to $H_2SO_4$, the thermal contribution from water vapor's heat of vaporization allows larger temperature increases for a given amount of dilution.

Figure 3:
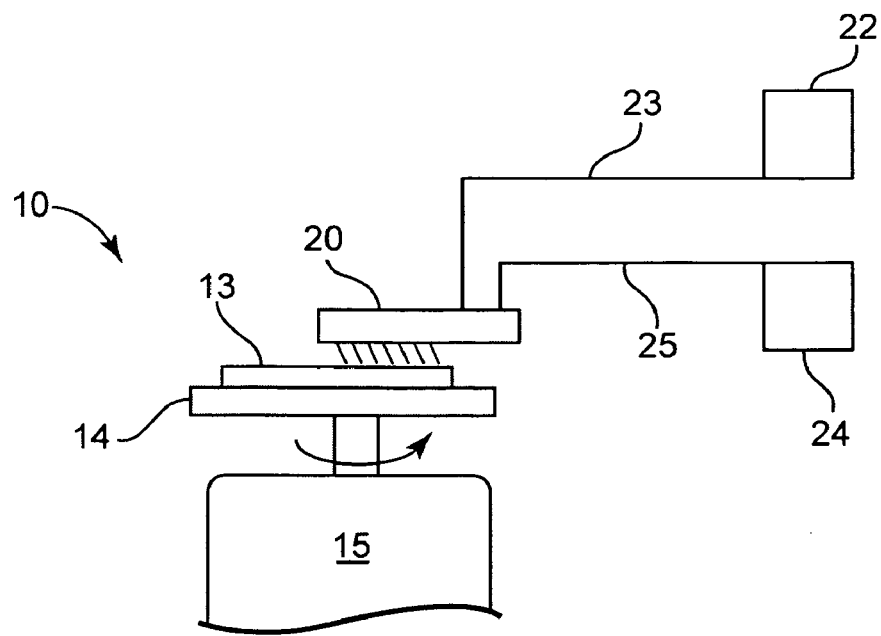
FIG. 3 is a schematic diagram of an apparatus that can carry out an embodiment of the process of the present invention.

FIG. 3 shows a modified spray processing system 10 for carrying out the present invention. In system 10, wafer 13, as a particular microelectronic device for example, is supported on a rotatable chuck 14 that is driven by a spin motor 15. This portion of system 10 corresponds to a conventional spray processor device. Spray processors have generally been known, and provide an ability to remove liquids with centrifugal force by spinning or rotating the wafer(s) on a turntable or carousel, either about their own axis or about a common axis. Exemplary spray processor machines suitable for adaptation in accordance with the present invention are described in U.S. Pat. Nos. 6,406,551 and 6,488,272, which are fully incorporated herein by reference in their entireties. Spray processor type machines are available from FSI International, Inc. of Chaska, Minn., e.g., under one or more of the trade designations MERCURY® or ZETA®. Another example of a single-wafer spray processor system suitable for adaptation in accordance with the present invention is available from SEZ AG, Villach, Austria and sold under the trade designation SEZ 323. Another example of a tool system suitable for adaptation in accordance with the present invention is described in U.S. patent application Ser. No. 11/376,996, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS, filed on Mar. 15, 2006; or as described in US Patent Application Publication No. 2005/0205115.

Wafers 13 have been coated with an organic material that is to be removed. In preferred embodiments, the organic material is photoresist material. Organic materials that are challenging to remove include photoresist that has been baked on by exposure to heat during previous wafer processing steps. Organic materials that are particularly challenging to remove are those that have been heavily ion implanted during previous wafer processing steps. The methods of the present invention are particularly and surprisingly effective in the removal of heavily ion implanted photoresist materials.

Spray bar 20 comprises a plurality of nozzles to direct liquid aerosol droplets onto wafer 13. Liquid sulfuric acid composition is provided from liquid supply reservoir 22 through line 23, and the stream of water vapor is similarly provided from supply reservoir 24 though line 25. Hydrogen peroxide is provided from peroxide supply reservoir 26 through line 27 to sulfuric acid supply line 23. This configuration permits addition of peroxide to the sulfuric acid composition with the benefit that the peroxide is not stored and heated in the presence of sulfuric acid, and additionally that the amount of peroxide used in the treatment method may be independently controlled from the amount of sulfuric acid as dictated by specific process requirements. Thus, a variable peroxide concentration can be applied during a treatment process as desired. Alternatively, the hydrogen peroxide can be supplied to the stream of water vapor at line 25. Spray bar 20 is preferably provided with a plurality of nozzles to generate aerosol droplets of treatment composition that results from impinging the stream of a liquid sulfuric acid composition with the stream of water vapor. In a preferred embodiment, nozzles are provided at a spacing of about 3.5 mm in spray bar 20 at locations corresponding to either the radius of the wafer or the full diameter of the wafer when spray bar 20 is in position over wafer 13. Nozzles may optionally be provided at different spacing closer to the axis of rotation as compared to the spacing of the nozzles at the outer edge of the wafer. A preferred spray bar configuration is described in U.S. Patent Application Ser. No. 60/819,133, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS, filed on Jul. 7, 2006.

Preferably, the liquid sulfuric acid composition has a water/sulfuric acid molar ratio of no greater than about 5:1. Thus, the liquid sulfuric acid composition is limited in water content. In one embodiment, the liquid sulfuric acid composition may comprise a solvent that does not substantially interfere with the coordination of subsequently added water vapor with sulfuric acid, as discussed in more detail herein. Preferred such solvents are inert with respect to the substrate to be treated (e.g. the wafer), such as fluorine based liquids. An example of such inert solvents include the Fluorinert™ solvents commercially available from 3M, St. Paul, Minn. It should be noted that the above mentioned molar ratio recites the water/sulfuric acid molar ratio, and not the solvent/sulfuric acid ratio. This underscores that the solvent that does not substantially interfere with the coordination of subsequently added water vapor with sulfuric acid does not factor into this ratio of the present inventive embodiment.

More preferably, the liquid sulfuric acid composition is highly concentrated. Preferably, the liquid sulfuric acid composition is dispensed at a sulfuric acid concentration of at least about 80 vol %, more preferably at least about 90 vol %, and most preferably at least about 94 vol %. As shown in FIGS. 1 and 2, these high $H_2SO_4$ concentrations result in the largest temperature rise per unit of water vapor condensed into the $H_2SO_4$ composition.

In an embodiment of the present invention, the liquid sulfuric acid composition comprises hydrogen peroxide. The hydrogen peroxide serves as an oxidant that assists in breaking down organic species to $CO_2$ and water. Hydrogen peroxide is conveniently provided in a water-containing solution blended with concentrated sulfuric acid to provide a liquid sulfuric acid composition having water/sulfuric acid molar ratio of no greater than about 5:1. Advantageously, mixing of concentrated sulfuric acid with a water-containing hydrogen peroxide solution generates heat by an exothermic reaction, and so the resulting liquid sulfuric acid composition comprising hydrogen peroxide can be provided at elevated temperature while using less energy from a dedicated heat source to heat the composition. This exothermic reaction is normally a significant source of heat for the composition. However, in the present invention the reaction between the sulfuric acid composition and water vapor provides the desired heat, and excess additions of water-based hydrogen peroxide can inhibit this sulfuric-vapor reaction. Therefore, with the knowledge of the effect of vapor in concentrated sulfuric acid compositions as described herein, the skilled artisan can now adjust the $H_2O_2$ concentration to simultaneously optimize the heat generated by the $H_2SO_4$-vapor reaction while supplying sufficient reactants to oxidize organics.

In an aspect of the present invention, an oxidizing agent can be introduced into the treatment chamber before, during or after dispense of the liquid sulfuric acid composition.

For example, hydrogen peroxide can be mixed with the liquid concentrated sulfuric acid prior to introduction of the liquid sulfuric acid composition into the treatment chamber, or alternatively during or after dispense of the liquid sulfuric acid composition in the treatment chamber. Mixing of the hydrogen peroxide with the liquid concentrated sulfuric acid can be accomplished by the use of static mixers or active mixing techniques, or can be merely contacting one solution with the other, with mixing being accomplished by mere diffusion. Other agents, such as ozone, may be similarly incorporated in the liquid sulfuric acid composition as desired. Water-free oxidants such as ozone may be superior to $H_2O_2$ as they will not dilute the $H_2SO_4$ composition. For example, oxidants other than $H_2O_2$ may be utilized in the inventive sulfuric-vapor process. For instance, ozone, nitric acid, the chromate ion ($Cr^{+6}$), or the ceric ion ($Ce^{+4}$) may be incorporated in the process as described herein. In particular, these species might be added to $H_2SO_4$ in an anhydrous form, so that the $H_2SO_4$ remains relatively undiluted. Other oxidants may also be used.

Preferably, the liquid sulfuric acid composition is dispensed at a temperature of at least about 90° C., and more preferably from about from about 90° C. to about 150° C. In another embodiment, the liquid sulfuric acid composition is preferably dispensed at a temperature of from about 95° C. to about 120° C. In another embodiment, the liquid sulfuric acid composition is dispensed at a temperature of at least about 130° C. prior to exposure to the water vapor, and more preferably from about 130° C. to about 200° C.

In one embodiment, wafer 13 is provided at a temperature below the boiling point of water, such as at a temperature of from about 20 to about 60° C. Wafer 13 is preferably heated to a temperature of at least about 90° C., either before, during or after dispensing of the liquid sulfuric acid composition. More preferably, wafer 13 is heated to a temperature of from about 90° C. to about 150° C. In another embodiment, the wafers are heated to a temperature of from about 95° C. to about 120° C. This heating can be carried out, for example, by heating the chamber using radiant heat, introduction of hot water or other liquid solution to the wafer with substantial removal of the heated liquid prior to application of the concentrated sulfuric acid composition, introduction of heated gases to the chamber, and the like. If a liquid is used to heat the wafer by direct contact to the wafer, sufficient amount of the liquid is removed from the wafers prior to introduction of the concentrated sulfuric acid composition so that the concentrated sulfuric acid composition maintains the desired level of sulfuric acid concentration prior to the exposure of the liquid sulfuric acid composition to water vapor.

In one embodiment of the present invention, the wafers can be preheated by submerging one or more wafers into a heated bath of liquid, quickly draining the contents of the bath (e.g. a "quickdump" procedure) and conducting the remaining treatment steps as described below. The bath liquid can be, for example, DI water, DI water containing sulfuric acid, sulfuric acid/hydrogen peroxide mixture, an inert fluid (such as a fluorocarbon), sulfuric acid/ozone mixture, and the like. This embodiment can provide substantial benefit in enhancing throughput of the treatment process by more efficiently heating the wafers. An example of a particularly suitable process system that can be used to employ this embodiment is the Magellan® system commercially available from FSI International, Chaska, Minn., Preferably, the water vapor is introduced so that it is exposed to the wafers at a water vapor temperature of from about 70° C. to about 160° C. More preferably, the water vapor is introduced so that it is exposed to the wafers at a water vapor temperature of from about 100° C. to about 150° C. In a particularly advantageous embodiment, the water vapor is introduced so that it is exposed to the wafers at a water vapor temperature of from about 120° C. to about 140° C. In a different advantageous embodiment, the water vapor is introduced so that it is exposed to the wafers at a water vapor temperature of about 130° C. This embodiment is relatively easy to carry out by boiling water under conventional conditions to form steam either inside or outside the treatment vessel by conventional steam forming apparatus.

In another embodiment, the water vapor is provided at a temperature greater than the temperature of the liquid sulfuric acid composition prior to exposure to the water vapor. This embodiment provides the benefit of direct heating of the liquid sulfuric acid composition by direct heat transfer, as well as the transfer of energy upon condensation of the water vapor into the liquid sulfuric acid as discussed above. In an embodiment, the water vapor is provided at a temperature greater than about 150° C. for this purpose.

Optionally, the water vapor can additionally comprise another agent, such as hydrogen peroxide, nitric acid or ozone, as desired.

The water vapor is introduced into the treatment chamber in an amount effective to increase the temperature of the liquid sulfuric acid composition above the temperature of the liquid sulfuric acid composition prior to exposure to the water vapor, and preferably additionally above the temperature of the water vapor. In an embodiment of the present invention, the liquid sulfuric acid composition is exposed to water vapor in an amount effective to increase the temperature of the liquid sulfuric acid composition on the substrate surface above both (i) the temperature of the on-substrate liquid sulfuric acid composition prior to exposure to the water vapor and (ii) the temperature of the water vapor. Surprisingly, even when the temperature of the liquid sulfuric acid composition is near or even above the boiling point of water, the water vapor still associates with the liquid sulfuric acid composition in a manner to increase the temperature of the liquid sulfuric acid composition, thereby enhancing the organic material removing effectiveness of the increase the temperature of the liquid sulfuric acid composition.

Preferably, sufficient liquid sulfuric acid composition and water vapor are present and mixed to increase the temperature of the liquid sulfuric acid composition by at least about 20° C., more preferably by at least about 40° C., and more preferably by at least about 60° C. This is particularly significant since the liquid sulfuric acid composition is in place on the wafer, which itself acts as a heat sink and absorbs substantial energy to maintain a temperature that is close to the temperature of the liquid sulfuric acid composition. The temperature of the liquid sulfuric acid composition on the substrate surface can be determined by any appropriate measuring technique.

Figure 4:
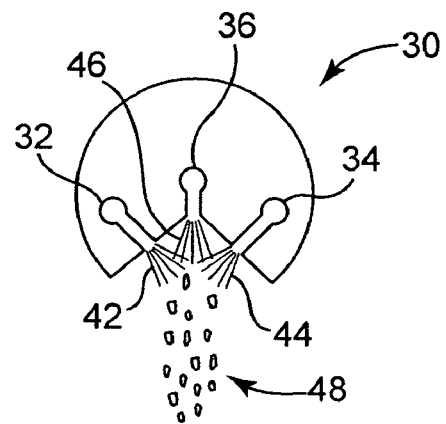
FIG. 4 is a cross sectional view of a spray bar for carrying out an embodiment of the process of the present invention.

A cross-sectional view of a spray bar 30 is shown in FIG. 4, illustrating a preferred nozzle configuration of the present invention. In this configuration, liquid sulfuric acid composition orifices 32 and 34 are directed inward to provide impinging streams 42 and 44. Water vapor dispense orifice 36 is located as shown in this embodiment between liquid sulfuric acid composition orifices 32 and 34, so water vapor stream 46 impinges with liquid sulfuric acid composition streams 42 and 44. As a result of this impingement, atomization occurs, thereby forming liquid aerosol droplets 48. In addition, the droplets are given enhanced directional momentum toward the surface of the substrate because of the relatively high pressure of the water vapor stream as it exits from water vapor dispense orifice 36. This centrally located orifice in the nozzle assembly thus provides an advantageous directional aspect to assist in removal of material from the surface of the substrate. Alternatively, the positioning of the orifices may be reversed, i.e., the liquid sulfuric acid composition may be dispensed from orifice 36 and water vapor may be dispensed from orifices 32 and 34. For purposes of the present invention, a grouping of liquid orifices and gas orifices configured to provide streams that impinge with each other to form a liquid aerosol droplet stream or distribution is considered a nozzle. Optionally, an additional component, such as a gas, may be dispensed from one or more orifices in the nozzle assembly. In one embodiment, liquid dispense orifices have a diameter of from about 0.020 to about 0.030 inch. In another embodiment, the liquid dispense orifices have a diameter of about 0.026 inch when located in the spray bar at a position corresponding to the center of the wafer to the mid radius of the wafer, and a diameter of about 0.026 inch from mid-radius of the wafer to the outer edge of the wafer. In an embodiment of the present invention, water vapor dispense orifices have a diameter of about 0.010 to about 0.030 inch, preferably about 0.020 inch.

The location, direction of the streams and relative force of the streams are selected to preferably provide a directional flow of the resulting liquid aerosol droplets, so that the droplets are directed to the surface of a substrate to effect the desired treatment.

In one embodiment, the liquid aerosol droplets are caused to contact the surface at an angle that is perpendicular to the surface of the wafer. In another embodiment, the liquid aerosol droplets are caused to contact the surface of the wafer at an angle of from about 10 to less than 90 degrees from the surface of the wafer. In another embodiment, the liquid aerosol droplets are caused to contact the surface of the wafer at an angle of from about 30 to about 60 degrees from the surface of the wafer. In a preferred embodiment, the wafer is spinning at a rate of about 250 to about 1000 RPMs during contact of the aerosol droplets with the surface of the wafer. The direction of the contact of the droplets with the wafer may in one embodiment be aligned with concentric circles about the axis of spin of the wafer, or in another embodiment may be partially or completely oriented away from the axis of rotation of the wafer. System 10 preferably employs suitable control equipment (not shown) to monitor and/or control one or more of fluid flow, fluid pressure, fluid temperature, combinations of these, and the like to obtain the desired process parameters in carrying out the particular process objectives to be achieved.

Figure 5:
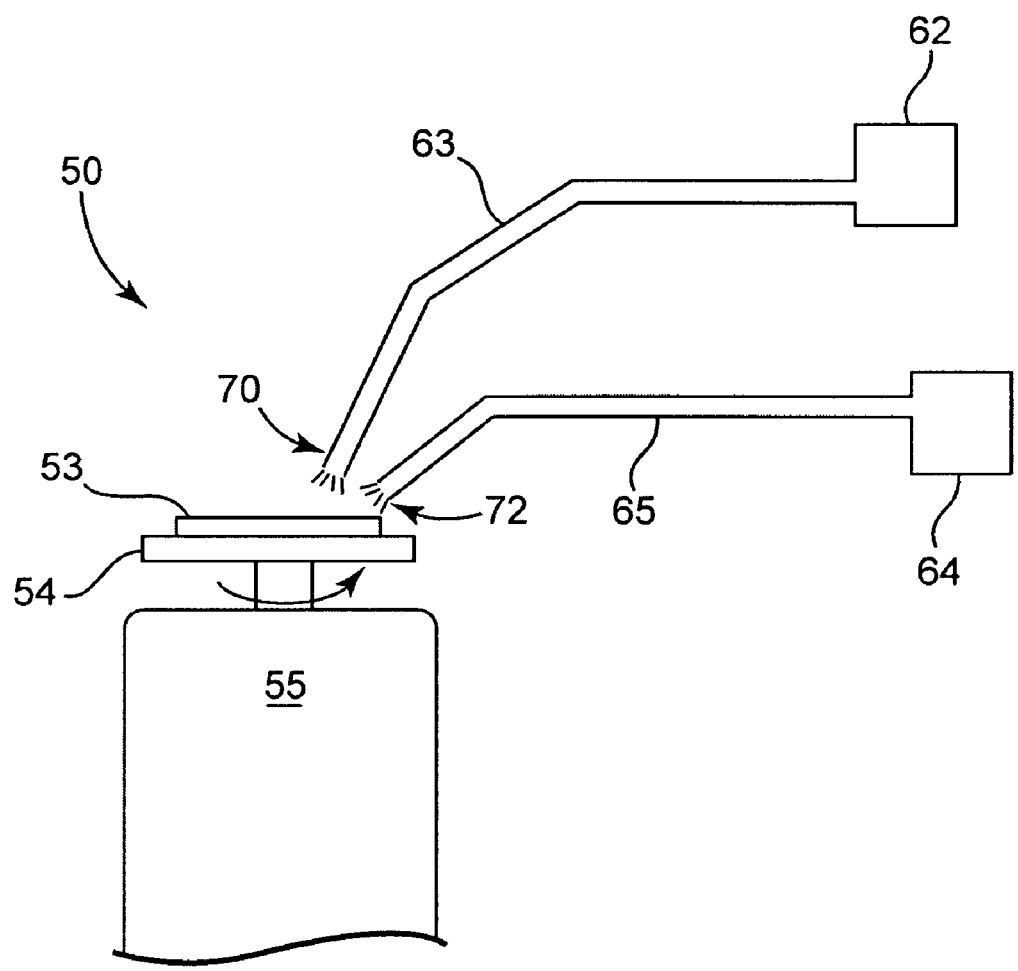
FIG. 5 is a schematic diagram of an apparatus that can carry out an embodiment of the process of the present invention.

FIG. 5 shows an example of a modified spray processing system 50 for carrying out an aspect of the present invention, where liquid sulfuric acid composition is dispensed onto a portion of the substrate surface that is less than the entire surface of the substrate. In system 50, wafer 53, as a particular microelectronic device for example, is supported on a rotatable chuck 54 that is driven by a spin motor 55. As above in system 10, this portion of system 50 corresponds to a conventional spray processor device. Liquid sulfuric acid composition is provided from liquid supply reservoir 62 through line 63 to dispense orifice 70, which is configured to dispensing liquid sulfuric acid composition onto a portion of the substrate surface that is less than the entire surface of the substrate. This controlled dispense permits localized treatment of the desired portion of wafer 53. Hydrogen peroxide is provided from peroxide supply reservoir 66 through line 67 to sulfuric acid supply line 63. This configuration permits addition of peroxide to the sulfuric acid composition with the benefit that the peroxide is not stored and heated in the presence of sulfuric acid, and additionally that the amount of peroxide used in the treatment method may be independently controlled from the amount of sulfuric acid as dictated by specific process requirements. Thus, a variable peroxide concentration can be applied during a treatment process as desired. A stream of water vapor is similarly provided from supply reservoir 64 though line 65 to dispense orifice 72. Alternatively, the hydrogen peroxide can be supplied to the stream of water vapor at line 65. Dispense orifices 70 and 72 may optionally be configured so that the stream of liquid sulfuric acid composition and the stream of water vapor at least partially intersect prior to impinging the surface of the substrate. Alternatively, dispense orifices 70 and 72 may optionally be configured so that the stream of liquid sulfuric acid composition and the stream of water vapor at least partially intersect on the surface of the substrate, or so that the stream of water vapor impinges the stream of liquid sulfuric acid composition before the stream of liquid sulfuric acid composition impinges the substrate. In an embodiment of the present invention, the dispense orifices 70 and 72 are moved together during the treatment to scan across the surface of the substrate. In an embodiment of the present invention, lines 65 and 67 can be linked to form a two orifice nozzle array to assist in positioning control for scanning across the surface of the substrate.

In an embodiment of the present invention, system 50 is configured so that the substrate is rotating, and dispense orifices 70 and 72 are positioned so that the stream of liquid sulfuric acid composition impinges the substrate at a point ahead of the point where the stream of water vapor impinges the substrate, relative to the rotational direction of the rotating substrate. Alternatively, system 50 may be configured so that the stream of water vapor impinges the substrate at a point ahead of the point where the stream of liquid sulfuric acid composition impinges the substrate, relative to the rotational direction of the rotating substrate.

In the embodiment wherein the liquid sulfuric acid composition is dispensed onto a portion of the substrate surface that is less than the entire surface of the substrate, water vapor may be generated in another manner that does not provide that the water vapor is in a stream that impinges either the substrate or the stream of liquid sulfuric acid composition. For example, heated DI water may be splashed down onto the rotating turntable, thereby generating water vapor. Alternatively, water vapor can be generated inside the treatment chamber by any appropriate alternative water vapor generation technique, such as by heating and/or agitating water in the treatment chamber. In yet another alternative, the water vapor can be generated outside of the treatment chamber and introduced to the treatment chamber in the desired water vapor form. In one embodiment, water vapor could be produced by bubbling a gas (e.g. $N_2$) through a column of water (preferably hot water). In another embodiment, the gas could pass over the surface of a quantity of water. In another embodiment, the gas could pass through an irrigated packed column as commonly used in chemical engineering. In another embodiment, substantially pure water vapor could be produced by boiling liquid water. The gaseous products from any of these alternatives could be further heated. Other embodiments are also possible.

The exposure of the liquid sulfuric acid composition to water vapor can be carried out at any time effective to increase the temperature of the liquid sulfuric acid composition when in place on the organic material coated substrate. In one embodiment, water vapor is introduced to the treatment chamber during the dispense of the liquid sulfuric acid composition. It will be appreciated that in this embodiment, the temperature of the liquid sulfuric acid composition may begin to increase even prior to contact of the composition with the substrate. In this embodiment, the increase of the temperature of the liquid sulfuric acid composition upon exposure to water vapor as discussed above can be taken to be the difference between the temperature of the liquid sulfuric acid composition at dispense and the maximum temperature of the liquid sulfuric acid composition after exposure to water vapor.

In another embodiment of the present invention, the liquid sulfuric acid composition is provided to the wafers not in a continuous stream, but rather in a plurality of discrete pulses. These pulses are preferably short (i.e. from about 3-10 seconds in length), and at high flow (i.e. at a flow rate of about 0.3-2 lpm). There preferably is a time period of about 5 to 20 seconds between pulses with no flow of liquid. When operating with pulsed liquid flow, water vapor optionally is only introduced during the pulse, reducing the amount of water vapor that is flushed from the chamber during the present process. Likewise, water vapor can be optionally introduced during the pulse, to enhance the temperature rise of the sulfuric acid composition before its contact with the substrate, or between pulses, to emphasize the heating of the composition while on the substrate. Alternatively, water vapor may be continuously introduced to the chamber, with the liquid sulfuric acid composition being provided to the wafers in a plurality of discrete pulses. In another embodiment, liquid sulfuric acid composition may be continuously introduced to the chamber, with the water vapor being provided to the wafers in a plurality of discrete pulses.

Additional manipulation steps are also contemplated during the described method, such as exposure of the substrate to megasonic energy before, during or after treatment by the liquid sulfuric acid composition.

It will be appreciated that the various embodiments of the method as described herein (such as variation in delivery of the sulfuric acid composition) are not limited to use with the specific apparatus of the figures, but rather are applicable to use in all configurations of treatment machines appropriate for use in carrying out the presently described methods.

The principles of the present invention will now be described in connection with the following illustrative examples.

Example 1

I. Experimental Techniques

A. Sample Preparation

Wafer samples were prepared for evaluation of effectiveness of removal of ion implanted photoresist as follows:

- 200 mm diameter silicon wafers were coated with Shipley UV6 248 nm photo resist.
- The photoresist coating on the wafers was then patterned using conventional photoresist patterning techniques.
- The patterned wafers were implanted with arsenic at an energy of 40 keV, and with a dose of either $5 \times 10^{14}$ or $1 \times 10^{15}$ atoms/cm$^2$ (5E14 or 1E15).
- In order to carry out certain tests, approximately 2×2 cm fragments or "chips" were cleaved from patterned wafers for use as samples.

B. On-Wafer Temperature Measurements

Measurements of the maximum on-wafer temperature were made by attaching labels to wafers with dots that changed color irreversibly at specified elevated temperatures (TL-10 series from Omega Engineering, Stamford, Conn.). The labels were covered with a 0.7 mm glass sheet attached with high temperature epoxy for protection from the stripping chemistries.

C. Treatment Process

The wafers prepared in the manner described above were treated in a single wafer spin spray processing tool wherein fluids are dispensed onto the wafer from a horizontal spray bar comprising an array of nozzles extended above the wafer to provide a spray footprint that spans the full radius of the wafer, so that as the wafer spins about its center, the full surface of the wafer is uniformly treated. The wafer to spray bar distance is about 1 inch and the wafer spinning speed is 300 rpm.

The sulfuric acid/peroxide composition that is dispensed in each of the examples is provided at a flowrate of 500 cc/min $H_2SO_4$+50 cc/min 30% $H_2O_2$. All processes preheat sulfuric acid to 150° C. before mixing with room temperature 30% hydrogen peroxide.

Specific treatments were carried out under the following conditions:

Comparative Process 1—Baseline Process

In this process, hot sulfuric acid/hydrogen peroxide composition was dispensed on a wafer through the above described spray bar, without simultaneous introduction of water vapor.

In this process, the wafer was first preheated for 30 seconds by directing hot water onto the wafer. Excess water was then spun off of the wafer. Then a composition of sulfuric acid and hydrogen peroxide was run up to the spray bar but diverted to the drain in order to stabilize the chemical flow. The sulfuric acid and hydrogen peroxide composition continued to flow to drain for an addition 180 seconds while the temperature of the sulfuric acid was increased and stabilized at 150° C. At this point the chemical composition was directed through the spray bar and onto the rotating wafer for predetermined dispense times ranging from 5 seconds to 300 seconds. Following the chemical dispense the wafer was rinsed with DI water and spun dry.

Comparative Process 2—Baseline Process with Bowl Steam

In this process, hot sulfuric acid/peroxide composition was dispensed on a wafer through the above described spray bar, with simultaneous introduction of water vapor into the chamber by dispensing 95° C. hot water into the bottom of the chamber bowl.

In this process, the wafer was first preheated for 30 seconds by directing hot water on the wafer. Excess water was then spun off of the wafer. 95° C. hot water was then dispensed into the bottom of the chamber bowl for 60 seconds to create water vapor. 95° C. hot water continued to be dispensed into the bottom of the chamber bowl for an additional 60 seconds while a composition of sulfuric acid and hydrogen peroxide was run up to the spray bar but diverted to the drain in order to stabilize the chemical flow. 95° C. hot water continued to be dispensed into the bottom of the chamber bowl and sulfuric acid and hydrogen peroxide composition continued to flow to drain for an additional 180 seconds while the temperature of the sulfuric acid was increased and stabilized at 150° C. At this point, 95° C. hot water continued to be dispensed into the bottom of the chamber bowl while the chemical composition was directed through the spray bar and onto the rotating wafer for predetermined dispense times ranging from 5 seconds to 300 seconds. Following the chemical dispense the wafer was rinsed with DI water and spun dry.

Inventive Process—Atomize Chemical Mixture with Steam

In this process, hot sulfuric acid/peroxide composition was dispensed on a wafer through the above described spray bar, with simultaneous introduction of water vapor in the chamber by directing steam through a series of orifices in the spray bar, thereby causing the stream of steam to impinge the stream of hot sulfuric acid/peroxide composition, thereby atomizing the hot sulfuric acid/peroxide composition. The steam was provided at a pressure of 30 psig steam, a temperature of 131.2° C., and a steam flowrate of 160 lpm.

In this process, the wafer was first preheated for 90 seconds by directing steam through the spray bar and onto the wafer. Steam continued to be dispensed onto the wafer for an additional 60 seconds while a composition of sulfuric acid and hydrogen peroxide was run up to the spray bar but diverted to the drain in order to stabilize the chemical flow. Steam continued to be dispensed onto the wafer and sulfuric acid and hydrogen peroxide composition continued to flow to drain for an additional 300 seconds while the temperature of the sulfuric acid was increased and stabilized at 150° C. At this point, steam continued to be dispensed through the spray bar and onto the wafer while the chemical composition was also directed through the spray bar and onto the rotating wafer for predetermined dispense times ranging from 20 seconds to 90 seconds. Following the chemical dispense the wafer was rinsed with DI water and spun dry.

E. Temperature Analysis

Figure 7:
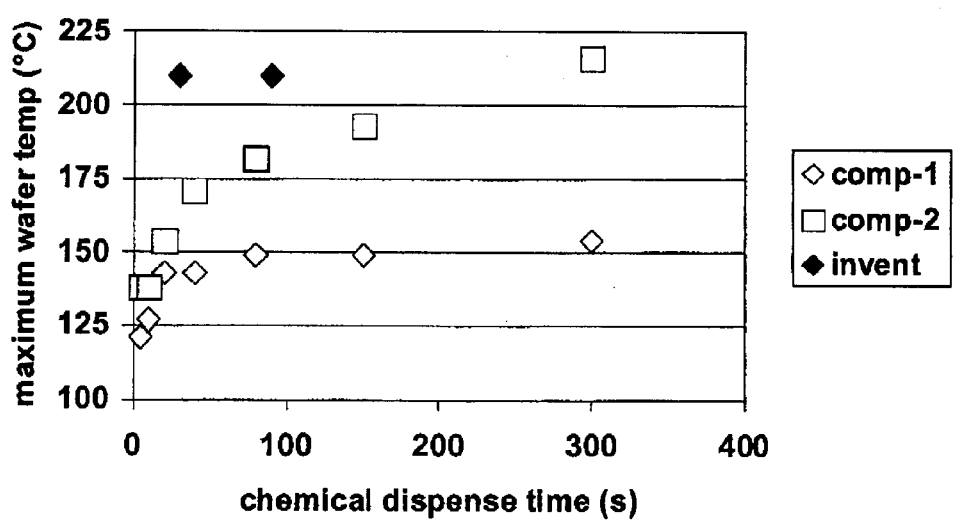
FIG. 7 is a graph showing wafer temperatures achieved by dispensing the sulfuric acid composition at the same temperature, but under different conditions of co-dispense with water vapor.

The graph shown in FIG. 7 shows the wafer temperatures achieved by dispensing the sulfuric acid composition at the same temperature, but under different conditions of co-dispense with water vapor. It was found that wafer temperatures were surprisingly much higher in a very short treatment period in the inventive system having impinging streams of sulfuric acid composition with steam, as compared to a control with no water vapor co-dispense, and with water vapor dispensed ambiently in the treatment chamber. In the graph legend, comp-1 refers to Comparative Process 1, described about, comp-2 refers to Comparative Process 2, described above, and invent refers to Inventive Process, described above.

F. Resist Removal Evaluation

After treatment of wafers and wafer chips as indicated, removal of resist and residues was evaluated by microscope inspection. The chemical dispense time sufficient to provide removal of all resist and residues in seconds is reported in the following Table I.

TABLE I

|  | Photoresist implant conditions $5 \times 10^{14}$ ions/cm$^2$ 40 keV, As | Photoresist implant conditions $1 \times 10^{15}$ ions/cm$^2$ 40 keV, As |
| --- | --- | --- |
| Comparative process 1 | 80 | >300 |
| Comparative process 2 | 40 | 300 |
| Invention | 20 | 90 |

This data shows that the inventive process provides surprisingly rapid removal of resist and residue as compared to a control with no water vapor co-dispense, and with water vapor dispensed ambiently in the treatment chamber.

Example 2

Additional experiments were conducted to demonstrate the effectiveness enveloping the substrate with water vapor and/or nitrogen gas during the treatment steps described above. In these experiments, oxide etch trials with and without the use of methodologies of the present invention were carried out. With the exception of the Control, oxide was etched from a wafer using SC-1 solution for 60 seconds at a 70° C. dispense temperature.

Figure 6:
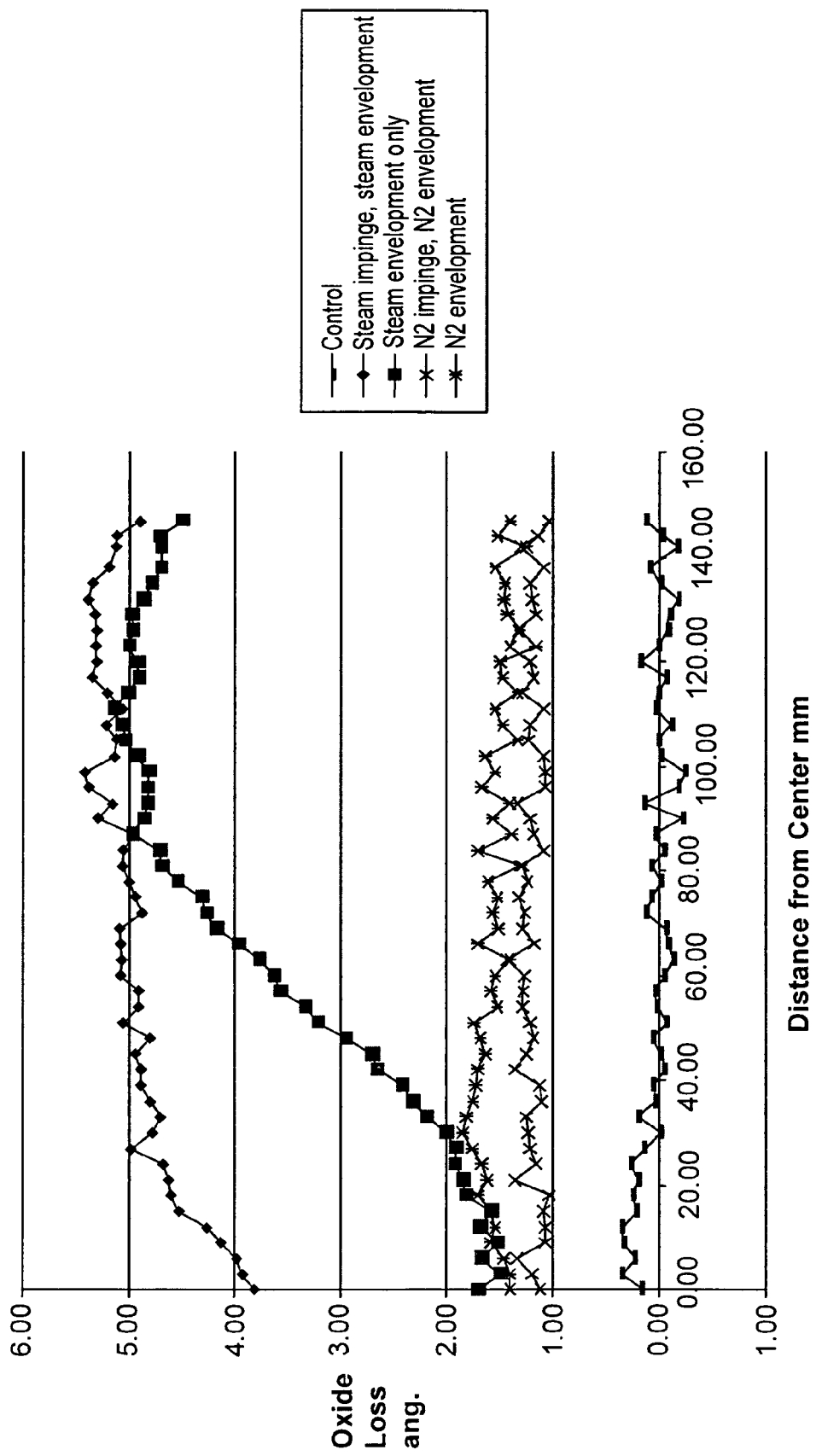
FIG. 6 is a graph showing experimental oxide etch results of trials with and without the use of methodologies of the present invention.

The results of these tests are graphically presented in FIG. 6.

Specifically, the lines on the graph show the following:
1) Control: Baseline process with no SC1 dispense on the wafer. This evaluation is performed to verify that the tool is operating correctly and not inadvertently contributing to the oxide etch.
2) Steam impinge, steam envelopment: The SC-1 stream is impinged with steam, and the wafer additionally is enveloped with a steam environment. This process produces the best overall oxide etch rate, roughly 3× to 4× the rate of processes without steam.
3) Steam envelopment only: The SC-1 stream is not impinged, but the wafer is enveloped with a steam environment. This process produces an edge-fast oxide etch profile.
4) $N_2$ impinge, $N_2$ envelopment: The SC-1 stream is impinged with $N_2$, and the wafer additionally is enveloped with a $N_2$ environment. This process produces a uniform etch profile with a comparatively low oxide etch rate.
5) $N_2$ envelopment only: The SC-1 stream is not impinged, but the wafer is enveloped with a $N_2$ environment. This process produces a uniform etch profile with a comparatively low oxide etch rate.

All percentages and ratios used herein are volume percentages and volume ratios unless otherwise indicated. It will be understood that if the treatment process is carried out at a different pressure, the temperatures of the various components involved in the process can be adjusted accordingly. All publications, patents and patent documents (including provisional patent applications) cited are fully incorporated by reference herein, as though individually incorporated by reference. Numerous characteristics and advantages of the invention meant to be described by this document have been set forth in the foregoing description. It is to be understood, however, that while particular forms or embodiments of the invention have been illustrated, various modifications, including modifications to shape, and arrangement of parts, and the like, can be made without departing from the spirit and scope of the invention.

The invention claimed is:

1. A method of removing material from a substrate, comprising
   a) placing a substrate having material on a surface thereof in a treatment chamber;
   b) dispensing a liquid sulfuric acid composition comprising sulfuric acid and/or its desiccating species and precursors onto a portion of the substrate surface that is less than the entire surface of the substrate in an amount effective to treat the portion of the substrate surface; and
   c) exposing the liquid sulfuric acid composition to water vapor in an amount effective to increase the temperature of the liquid sulfuric acid composition above the temperature of the liquid sulfuric acid composition prior to exposure to the water vapor;
wherein the liquid sulfuric acid composition at the time of exposure to water vapor has a water/sulfuric acid molar ratio of no greater than about 5:1.

2. The method of claim 1, wherein the liquid sulfuric acid composition is exposed to water vapor in an amount effective to increase the temperature of the liquid sulfuric acid composition on the substrate surface above both (i) the temperature of the on-substrate liquid sulfuric acid composition prior to exposure to the water vapor and (ii) the temperature of the water vapor.

3. The method of claim 1, wherein the liquid sulfuric acid composition at the time of exposure to water vapor has a water/sulfuric acid molar ratio of no greater than about 2:1.

4. The method of claim 1, wherein an oxidizing agent is introduced into the treatment chamber during or after dispense of the liquid sulfuric acid composition.

5. The method of claim 2, wherein the liquid sulfuric acid composition is dispensed at a temperature of from about 130° C. to about 200° C. prior to exposure to the water vapor.

6. The method of claim 3, wherein the material is a photoresist.

* * * * *